United States Patent [19]

Fujiwara

[11] Patent Number: 4,629,998
[45] Date of Patent: Dec. 16, 1986

[54] VARIABLE GAIN EQUALIZER WITH A MIRROR CIRCUIT HAVING OPPOSITE PHASE RELATIONSHIP BETWEEN INPUT AND OUTPUT CURRENTS

[75] Inventor: Nobuo Fujiwara, Yokohama, Japan

[73] Assignee: Victor Company of Japan, Limited, Yokohama, Japan

[21] Appl. No.: 667,394

[22] Filed: Nov. 2, 1984

Related U.S. Application Data

[63] Continuation of Ser. No. 313,706, Oct. 21, 1981, abandoned.

[30] Foreign Application Priority Data

Oct. 23, 1980 [JP] Japan .................. 55-148557
Oct. 23, 1980 [JP] Japan .................. 55-165733

[51] Int. Cl.$^4$ ............... H03F 3/04; H03G 3/20
[52] U.S. Cl. ..................... 330/304; 330/288; 330/278
[58] Field of Search ............ 330/278, 279, 285, 288, 330/304

[56] References Cited

U.S. PATENT DOCUMENTS 4,109,162  8/1978  Heuser et al. ............... 357/92
4,178,584 12/1979  Davis ......................... 357/92
4,316,149  2/1982  Yamaguchi .................. 330/255

FOREIGN PATENT DOCUMENTS 2438472  3/1975  Fed. Rep. of Germany ...... 330/296

OTHER PUBLICATIONS

R. Heaton, CMOS Magnetic Cartridge Pre-Amplifier, Practical Electronics, vol. 12, No. 10, p. 823, Oct. 1976.

Primary Examiner—Gene Wan
Attorney, Agent, or Firm—Pollock, VandeSande & Priddy

[57] ABSTRACT

A variable gain equalizer comprises an equalizing network having an impedance element coupled between an input terminal to which an input voltage is applied and an output terminal. A potentiometer is provided having first and second mutually complementarily variable resistance portions divided by a slidable tap having an inherent contact resistance connected to ground. The first and second portions of the potentiometer are coupled in the equalizing network in series with the impedance element. An inversion type current mirror circuit causes an input alternating current to flow as a function of the input voltage in the contact resistance of the potentiometer through the first resistance portion and causes an output alternating current of equal amplitude to, but opposite phase to, the input alternating current to flow in the contact resistance through the second resistance portion and impedance element to the output terminal.

7 Claims, 3 Drawing Figures

VARIABLE GAIN EQUALIZER WITH A MIRROR CIRCUIT HAVING OPPOSITE PHASE RELATIONSHIP BETWEEN INPUT AND OUTPUT CURRENTS

This application is a continuation, of application Ser. No. 313,706, filed Oct. 21, 1981 now abondoned.

BACKGROUND OF THE INVENTION

The present invention relates to a variable gain equalizer. The variable gain equalizer of the invention is suitable for use with record styluses having a wide range of output voltages.

It is recognized that constant gain equalizers are disadvantageous to meet the particular operating output range of a record stylus which may vary from 0.1 mV to as high as 10 mV over the spectrum of audio frequencies. This arises from the fact that at higher input levels distortions are likely to occur in the equalized output and at lower input levels the output is too low for amplification.

A variable gain equalizer has been developed to meet this purpose. The prior art variable gain equalizer comprises a negative feedback amplifier having an equalizing impedance element connected in the feedback loop. The amplifier gain is adjusted by a grounded tap potentiometer coupled to the feedback loop. Since the grounded sliding tap has an inherent contact resistance and since this resistance value is erratic in nature, problem arises that the variable gain of the conventional equalizer is not definitely determinable.

SUMMARY OF THE INVENTION

It is therefore an object of the invention to provide a variable gain equalizer which eliminates the prior art problem with the use of an inversion type current mirror circuit which supplies alternating currents of equal but opposite phase through a potentiometer so that undesirable erratic voltage fluctuations are cancelled in the grounded sliding tap.

The variable gain equalizer of the present invention comprises an equalizing network including an impedance element coupled between an input terminal to which an input voltage is applied and an output terminal, a potentiometer having first and second mutually complementarily variable resistance portions divided by a slidable tap having an inherent contact resistance connected to ground, the first and second portions being coupled in the equalizing network in series with the impedance element. The inversion type current mirror circuit causes an input alternating current to flow as a function of the input voltage in the contact resistance of the sliding tap through the first resistance portion and causes an output alternating current of equal amplitude to, but opposite phase to, the input alternating current to flow in the contact resistance through the second resistance portion and impedance element to the output terminal.

Preferably, the inversion type current mirror circuit comprises a constant current source, and a transistor having a base (or gate electrode) coupled to ground, an emitter (or source electrode) coupled to the constant current source and to the input terminal and a collector (or drain electrode) coupled to the output terminal to allow a constant direct current from the current source to split at the emitter into equal amounts of input and output direct currents for application to the input and output terminals, respectively. In response to an input audio signal from a record stylus, the input and output direct currents are modulated at audio frequencies so that they vary in equal amplitude of 180 degrees out of phase to each other and are cancelled out in the contact resistance of the grounded sliding tap of the potentiometer.

BRIEF DESCRIPTION OF THE DRAWINGS

The invention will be described in further detail with reference to the accompanying drawings, in which.

DETAILED DESCRIPTION

Figure 1:
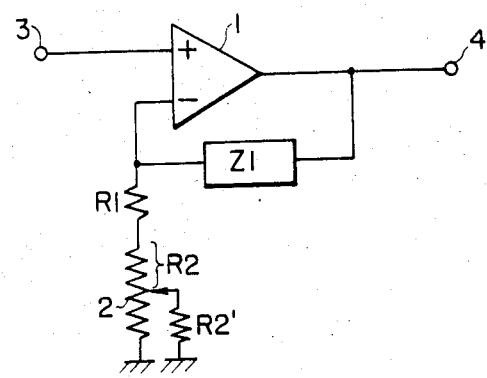
FIG. 1 is an illustration of a prior art variable gain equalizer.

Before describing the present invention reference is first made to FIG. 1 in which an embodiment of a prior art variable gain equalizer circuit is shown. This prior art circuit comprises an amplifier 1 and a feedback impedance having an impedance value Z1 connected between the amplifier output 4 and the amplifier inverting input so that the amplifier 1 has a desired equalizing frequency characteristic. The circuit further includes a potentiometer 2 and a resistor of fixed value R1 which are connected in series between the amplifier inverting input and ground. The potentiometer 2 has its sliding tap connected to ground so that its variable resistance R2 is measured across the sliding point and the point of connection to resistor R1. The sliding point of potentiometer 2 has an inherent contact resistance R2' as shown in FIG. 1 through which part of the feedback current is passed to ground. Since the voltage gain Av1 of the amplifier 1 is determined by $(R1+R2+R2'+Z1)/(R1+R2+R2')$ and since the contact resistance R2' has no definite value which becomes nonlinear at very low voltages, it is difficult to ensure that the amplifier 1 have a constant voltage gain under varying operating conditions, thus resulting in an undesirable distortion in the amplifier output signal.

Figure 2:
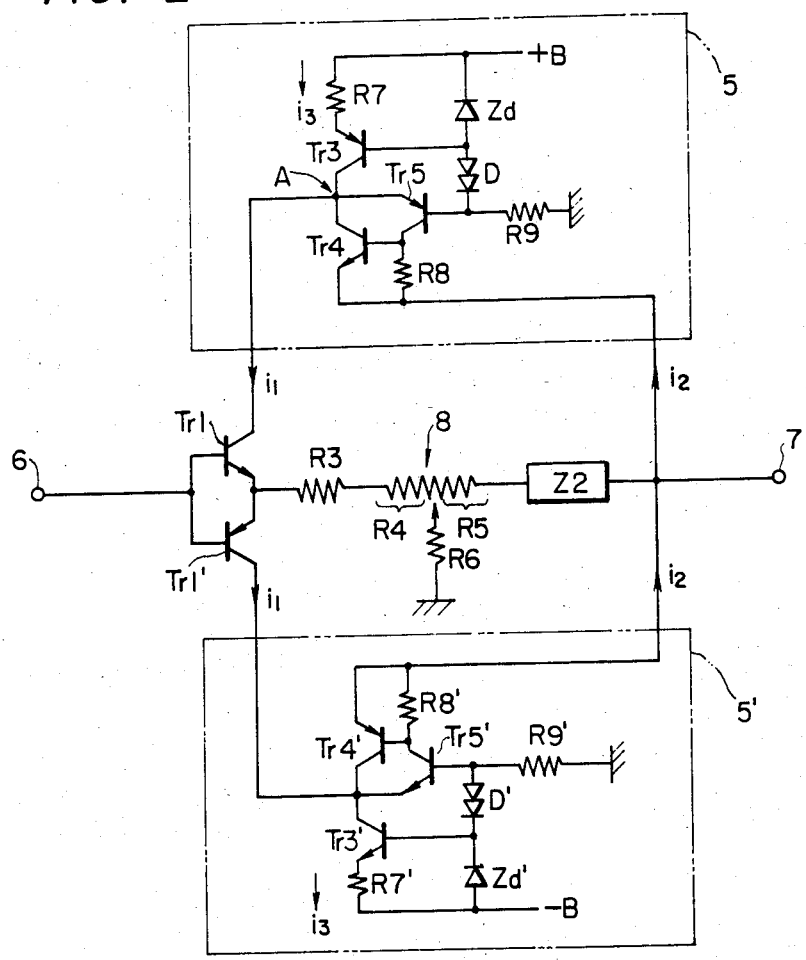
FIG. 2 is a circuit diagram of a variable gain equalizer according to the invention.

Referring now to FIG. 2, an embodiment of a variable gain equalizing circuit according to the invention is illustrated. The circuit comprises a pair of complementary emitter-follower transistors Tr1 and Tr1' of opposite conductivity types having their bases connected together to an input terminal 6 and having their emitters connected together to the output terminal 7 through an equalizing circuit including a resistor R3, a potentiometer 8 and an impedance element Z2. The potentiometer 8 has a contact resistance R6 at the sliding tap thereof which is connected to ground and divides the potentiometer by a ratio of R4 on the input side to R6 on the output side.

A pair of identical inverted current mirror circuits 5 and 5' is provided. As will be understood by a description later, the term "inverted mirror" is used since each of the circuits 5, 5' supplies an input, or source current $i_1$ which passes through transistor Tr1 (Tr1'), resistances R3, R4 and R6 to ground, and provides a return current $i_2$ which is identical to $i_1$ but passes through resistance R6 in opposite direction to $i_1$ and through resistance R5 and impedance Z2 and returns to each circuit. Although a single inverted current mirror circuit may be employed for the purpose of the invention, the use of the paired inverted current mirror circuits is preferred for practical purposes. In that instance, the current mirror circuit 5 comprises semiconductor elements whose conductivity types are opposite to those of the circuit 5'.

Input signal applied to terminal 6 is converted into current $i_1$ and develops an input voltage. Since the currents flowing through the contact resistance R6 are of equal magnitude of opposite polarities, no voltage is developed across the resistance R6. The input voltage and output voltages are thus represented by $i_1$(R3+R4) and $i_2$(R5+Z2), respectively. The voltage gain Av2 of the equalizer is therefore given by Av2=(R5+Z2)/(R3+R4). It is seen therefore the voltage gain is rendered variable exclusively as a function of resistance values R4 and R5 which are determined definitely by the potentiometer.

In a preferred embodiment of the present invention, each inverted current mirror circuit comprises a constant current source formed by a resistor R7, transistor Tr3 and Zener diode Zd (the corresponding elements in the current mirror circuit 5' being designated by primed numerals), an inverted Darlington amplifier formed by a transistor Tr4 and Tr5 so that the collector of transistor Tr4 is connected to the emitter of transistor Tr5 and the collector of transistor Tr5 is connected to the base of transistor Tr4 on the one hand and further connected on the other hand to the emitter of transistor Tr4 through a resistor R8. The collector of transistor Tr4 is further connected to the collector of transistor Tr3 and to the collector of transistor Tr1 to serve as a point through which current $i_1$ flows. The emitter of transistor Tr4 is connected to the output terminal 7 and serves as a point through which current $i_2$ flows. The circuit junction between the base of transistor Tr3 and Zener diode Zd is coupled to ground through a series circuit including a level shifting diode D and a resistor R9 which allows a predetermined amount of current to flow through the Zener diode Zd to develop a constant voltage thereacross. The base of transistor Tr5 is coupled to the junction between diode D and resistor R9.

A constant current $i_3$=(Vz−Vbe3)/R5 (where Vz is the breakdown voltage of Zener diode Zd and Vbe3, the base-emitter voltage of transistor Tr3) passes through resistor R7 to the emitter of transistor Tr3. Since the base current of transistor Tr3 is negligibly small compared to current $i_3$, the collector current of Tr3 can be considered substantially equal to $i_3$.

Figure 3:
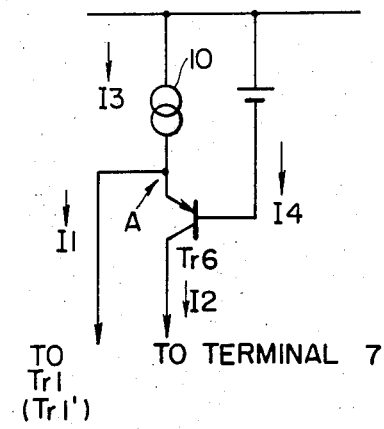
FIG. 3 is a circuit diagram illustrating an equivalent circuit of a current mirror circuit of FIG. 2.

Referring to FIG. 3 in which an equivalent circuit of each inverted current mirror circuits is shown, a constant direct current I3 is supplied from a constant current source designated 10 and split into two direct current components I1 and I2 at a circuit junction "A", the current component I1 being supplied to transistor Tr1 and the other component I2 being supplied to output terminal 7 via a transistor Tr6 which represents the inverted Darlington amplifier. By virtue of the inherent large current amplification gain of the Darlington amplifier, a base current I4 to the transistor Tr6 is negligibly small compared with its collector current I2.

Since I3=I1+I2, a relation I1=I3−I2 holds. By appropriately proportioning the input direct current I1 so that it equals one-half of the constant direct current I3, the output current I2 is rendered equal in magnitude to the input current I1 but opposite in polarity thereto.

It is appreciated therefore that when alternating current signal is applied to the input terminal 6, the input direct current I1 is modulated to produce a.c. component $i_1$ and the output direct current I2 is modulated to produce a.c. component $i_2$ which is equal in amplitude to $i_1$ but 180 degrees out of phase with respect thereto.

Since the impedance at the current supply point A is significantly low, an appreciable amount of variation in current I4 will only result in a negligibly small voltage variation at the circuit junction A. This significantly improves the equalizer's higher frequency response characteristics.

The embodiments shown and described above are only illustrative, not restrictive. Various modifications are apparent to those skilled in the art without departing from the scope of the invention which is only limited by the appended claims. For example, the Darlington amplifier of the current mirror circuits 5, 5' could equally be as well formed by field effect transistors.

What is claimed is:

1. A variable gain equalizer comprising:
   an equalizing network including an impedance element coupled between an input terminal to which an input voltage is applied and an output terminal;
   a potentiometer having first and second mutually complementarily variable resistance portions divided by a slidable tap having an inherent contact resistance connected to a reference potential, said first and second resistance portions being coupled in said equalizing network in series with said impedance element; and
   circuit means for causing an input alternating current to flow as a function of said input voltage in said contact resistance through said first resistance portion and causing an output alternating current of equal amplitude, but opposite phase, to said input alternating current to flow in said contact resistance through said second resistance portion and said impedance element to generate at said output terminal an output voltage proportional to said output alternating current.

2. A variable gain equalizer as claimed in claim 1, wherein said equalizing network includes a transistor having a base coupled to said input terminal and having a collector-emitter path coupled between said circuit means and said first resistance portion.

3. A variable gain equalizer as claimed in claim 2, further comprising a second circuit means identical to the first-mentioned circuit means for causing a second input alternating current to flow in said contact resistance as a function of said input voltage and causing a second output alternating current of equal amplitude, but opposite phase, to said second input alternating current to flow in said contact resistance, wherein said equalizing network includes a second transistor having a base coupled to said input terminal and having a collector-emitter path coupled between said second circuit means and said first resistance portion.

4. A variable gain equalizer as claimed in claim 3, wherein said second transistor is of opposite conductivity type to the conductivity type of the first-mentioned transistor.

5. A variable gain equalizer as claimed in claim 2, wherein said circuit means comprises:
   a constant current source; and
   a second transistor having a base or gate electrode coupled to said reference potential, an emitter or source electrode coupled to a first circuit junction between said constant current source and the first-mentioned transistor and a collector or drain electrode coupled to a second circuit junction between said impedance element and said output terminal to allow a constant direct current from said current source to split at said first circuit junction into equal direct currents for application to said first transistor and said impedance element, respectively.

6. A variable gain equalizer as claimed in claim 5, wherein said second transistor comprises a Darlington amplifier.

7. A variable gain equalizer as claimed in claim 5, further comprising a third transistor having a base or gate electrode coupled to the collector or drain electrode of said second transistor, a collector or drain electrode coupled to said constant current source and an emitter or source electrode coupled to the base or gate electrode of the third transistor through a resistor.

* * * * *